(12) United States Patent
Boerstler et al.

(10) Patent No.: US 7,260,491 B2
(45) Date of Patent: Aug. 21, 2007

(54) DUTY CYCLE MEASUREMENT APPARATUS AND METHOD

(75) Inventors: David W. Boerstler, Round Rock, TX (US); Eskinder Hailu, Austin, TX (US); Jieming Qi, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 13 days.

(21) Appl. No.: 11/260,570

(22) Filed: Oct. 27, 2005

(65) Prior Publication Data

US 2007/0100505 A1 May 3, 2007

(51) Int. Cl.
*G06F 19/00* (2006.01)
(52) U.S. Cl. .......................... 702/79; 702/176
(58) Field of Classification Search .................. 702/79, 702/176, 182–185, 188
See application file for complete search history.

(56) References Cited

U.S. PATENT DOCUMENTS

2004/0095113 A1* 5/2004 Kernahan et al. ........... 323/282

OTHER PUBLICATIONS

U.S. Appl. No. 10/970,284, filed Oct. 21, 2004, Boerstler et al.

* cited by examiner

*Primary Examiner*—Edward Raymond
(74) *Attorney, Agent, or Firm*—Stephen J. Walder, Jr.; Diana R. Gerhardt

(57) ABSTRACT

A mechanism for measuring duty cycle of a signal under test in an integrated circuit device, such as a microprocessor or system-on-a-chip is provided. The mechanism generates a frequency which is proportional to the duty cycle and which can be measured using common lab or manufacturing equipment. The mechanism may be implemented using simple circuits in a standard complementary metal oxide semiconductor process which requires very little area and can be powered off when it is not being used. The mechanism may include, for example, a low pass filter, a voltage divider for providing calibration reference voltage signals, a voltage to frequency converter, a frequency divider for dividing a frequency signal output so that the frequency of the signal is within a predetermined range, and an output driver and output pad. From the frequency output signal, a duty cycle of the signal under test may be calculated using off-chip equipment.

18 Claims, 5 Drawing Sheets

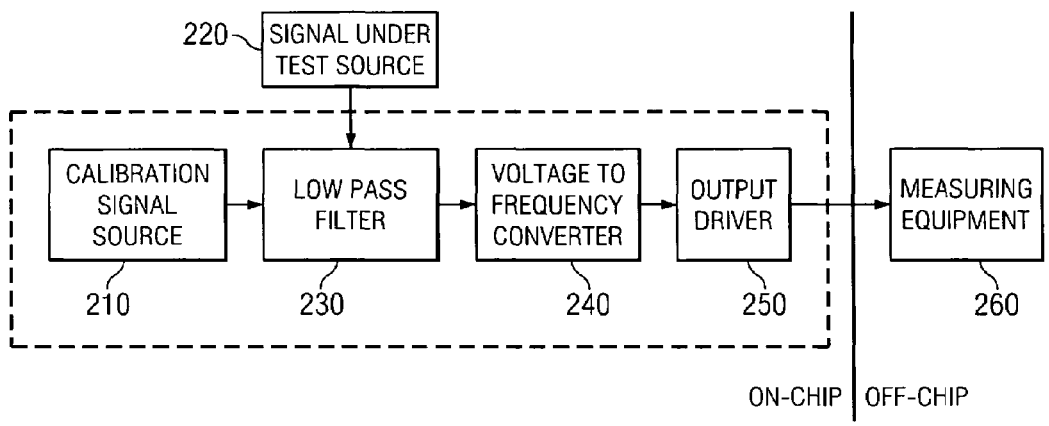
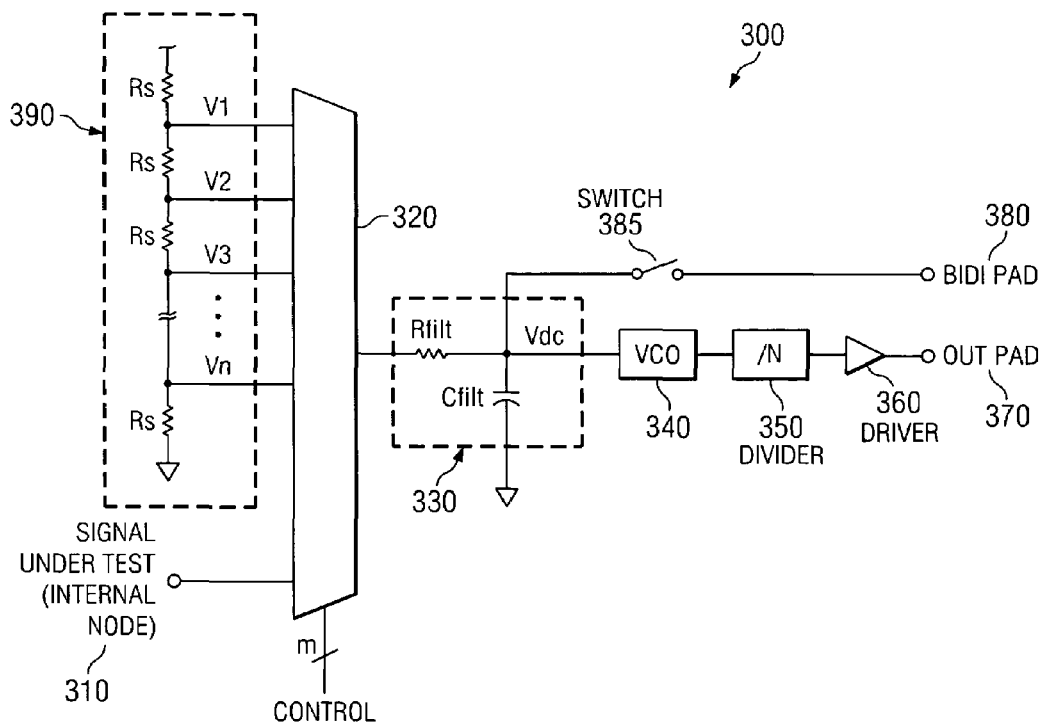

DUTY CYCLE MEASUREMENT APPARATUS AND METHOD

BACKGROUND

1. Technical Field

The present application relates generally to an improved integrated circuit apparatus and method. More specifically, the present application is directed to a duty cycle measurement apparatus and method.

2. Description of Related Art

The speed at which modern integrated circuit devices, such as microprocessors or systems-on-a-chip, operate has been greatly increasing in recent years. With such high speed devices variations in duty cycle, i.e. the ratio of pulse duration to a pulse period, may cause performance degradation if a mid-cycle edge is used. Moreover, variations in duty cycle may limit functionality if the clocked circuits depend upon minimum up or down time of the clock cycle, e.g., dynamic circuits.

Duty cycle is sensitive to many different factors including operating frequency, operating temperature, supply voltage, circuit design style, circuit loading, and process (e.g., variations in the doping, threshold voltage, mobility, gate oxide thickness, etc. across single and/or multiple wafers). Because so many different factors may affect duty cycle, it is important to be able to accurately measure clock duty cycle at the point of use on the chip under actual operating conditions.

However, limitations on bandwidth of off-chip connections generally constrain practical measurement to a few hundred MHz. This is at least an order of magnitude lower frequency than the frequency at which current integrated circuit devices, e.g., microprocessors or systems-on-a-chip, operate. Thus, due to limitations of off-chip connections, it is very difficult to obtain accurate measurements of clock duty cycle at the point of use on the chip under actual operating conditions.

SUMMARY

The illustrative embodiments provide mechanisms for measuring duty cycle of an integrated circuit device, such as a microprocessor or system-on-a-chip (SOC). The mechanisms of the illustrative embodiments generate a frequency which is proportional to the duty cycle and which can be measured using common lab or manufacturing equipment. The mechanisms of the illustrative embodiments may be implemented using simple circuits in a standard Complementary Metal Oxide Semiconductor (CMOS) process which requires very little area and can be powered off when it is not being used.

In an illustrative embodiment, a signal under test is provided as an input to a low pass filter via a multiplexer or other switching network in a way that preserves the duty cycle of the original signal under test. The low pass filter (LPF) may be implemented as a single-pole resistance-capacitance (RC) network which may be fabricated simply using a standard CMOS process. The LPF essentially determines an average value of the signal under test.

The LPF generates a direct current (DC) voltage, Vdc, that is proportional to the duty-cycle of the signal under test, e.g., Vdc=duty cycle*Vdd, where Vdd is the supply voltage. The bandwidth of the low pass filter is set low enough to generate a DC value and properly attenuate the alternating current (AC) components of the signal under test. The bandwidth is further set such that the bandwidth is not so low that the time constant of the low pass filter would add unacceptably large settling time for the measurements. For example, for a 5 Ghz signal under test, a filter with 5 MHz bandwidth adequately reduces the AC components and requires 100 nsecs settling time.

The low pass filter is connected to the control input of a voltage-controlled oscillator (VCO) which has a voltage-to-frequency gain characteristic, KO. In one preferred embodiment, the VCO gain KO is linear however the present invention is not limited to such an embodiment and non-linear VCO gain characteristics may be used without departing from the spirit and scope of the present invention.

The VCO translates the DC voltage at its input to a frequency which may be too high for directly bringing off-chip through low bandwidth drivers. Thus, the output of the VCO is coupled to a frequency divider which scales the VCO output frequency down by a factor of N. The resulting scaled down output signal is provided to an output driver which is connected to a pad through which the output signal may be measured using a frequency counter, oscilloscope, or other standard lab or manufacturing equipment. As a result, the duty cycle of the signal under test may be determined from the frequency measure on the output pad, e.g., duty cycle=freq.*N/(Vdd*KO).

Because practical VCOs show variations in KO due to process, temperature, supply voltage, and the like, and may have many non-linearities, it is important to understand these variations and be able to calibrate the VCO's gain characteristic KO prior to use in measuring the duty cycle of the signal under test. A voltage divider, which is used to perform this calibration, may be coupled to the multiplexer or other switching element through which the signal under test is coupled to the low pass filter. The voltage divider provides a plurality of reference voltages which may be individually connected to the low pass filter. The voltage values may be determined by using the simple voltage division equation Vdd*R1/R2, where R1 is the total resistance from a sense node to ground and R2 is a total resistance value from Vdd to ground. The voltage value, along with the sensed frequency may be used to calculate a KO value for the VCO, e.g., KO=freq./Vn. By using a plurality of reference voltages and corresponding frequency measurements, a calibration curve may be determined which can be used with an actual frequency measurement to determine the KO value for the VCO, e.g., KO=(fb−fa)/(Vb−Va), where fa<fx<fb.

In addition to the above, a bidirectional (bidi) pad and switch may be coupled to the input of the VCO. This bidi pad may be used to measure the applied voltage to the VCO during calibration if resistor tolerance is an issue. The bidi pad may also be used to apply an external voltage directly to the low pass filter (either side of the filter resistor) if the calibration granularity is too large. The switch is included to reduce noise pickup when the bidi pad is not being used.

In one illustrative embodiment, a method is provided for measuring a duty cycle of a signal under test. This method may be implemented in a data processing system. The method may comprise filtering an input signal to generate an output voltage signal, converting the output voltage signal to a frequency signal that is proportional to the output voltage signal, and measuring a frequency of the frequency signal. A duty cycle of the input signal may be calculated based on the measured frequency. The output voltage signal may represent an average voltage of the input signal. The filtering and converting operations may be performed on an integrated circuit chip and the measuring and calculating operations are performed externally to the integrated circuit chip.

The method may further include receiving a plurality of calibration signals and a signal under test, and selecting one of the plurality of calibration signals or the signal under test to be the input signal. The plurality of calibration signals may be reference voltage signals that are used to calibrate a voltage to frequency converter that converts the output voltage signal to a frequency signal that is proportional to the output voltage signal.

One of the plurality of calibration signals may be selected to be the input signal when performing calibration of a voltage to frequency converter that converts the output voltage signal to a frequency signal that is proportional to the output voltage signal. Calibrating the voltage to frequency converter may include generating a calibration curve that maps an input voltage to an output frequency for the plurality of calibration signals.

The method may further include receiving, as the input signal, an input voltage signal from a device that is external to the data processing system via a bi-directional pad. The method may also include dividing the frequency signal by a predetermined factor to place the frequency signal within a bandwidth requirement for providing the frequency signal to a measurement device for measuring the frequency of the frequency signal. The method may further comprise repeating the filtering, converting, measuring, and calculating operations at the same or different points in the data processing system to identify variations in duty cycle of a high speed clock signal, provided as the input signal.

In a further illustrative embodiment, an apparatus for measuring a duty cycle of a signal under test in an integrated circuit device is provided. The apparatus may comprise a filter that receives an input signal and outputs an output voltage signal and a voltage to frequency converter coupled to the filter that converts the output voltage signal to a frequency signal that is proportional to the output voltage signal. The apparatus may further comprise an output driver that drives the frequency signal to an output pad coupled to the output driver. A measurement device, external to the integrated circuit device, may measure a frequency of the frequency signal at the output pad and calculate a duty cycle for the signal under test based on the measured frequency.

The apparatus may further include a multiplexer coupled to an input of the filter. The multiplexer may receive a plurality of calibration signals and a signal under test, and may select one of the plurality of calibration signals or the signal under test to output to the filter. The apparatus may also include a bi-direction pad coupled to an input of the voltage to frequency converter. An input voltage signal may be received, as the input signal, from a device that is external to the apparatus via the bi-directional pad. The voltage to frequency converter may further comprise a frequency divider coupled to an output of the voltage-controlled oscillator which divides a frequency of a frequency signal output by the voltage-controlled oscillator by a predetermined amount.

The apparatus may be part of a toy, a game machine, a game console, a hand-held computing device, a personal digital assistant, a communication device, a wireless telephone, a laptop computing device, a desktop computing device, a server computing devices, or a portable computing device. The apparatus may also be part of a multi-processor system-on-a-chip having at least two heterogeneous processors having different types of instruction sets.

In yet another illustrative embodiment, a system-on-a-chip is provided that may comprise a control processor, at least one co-processor coupled to the control processor, and a duty cycle measuring apparatus coupled to one or more of the control processor or the at least one co-processor. The duty cycle measuring apparatus may comprise a filter that receives an input signal from one of the control processor or the co-processor and outputs an output voltage signal and a voltage to frequency converter coupled to the filter that converts the output voltage signal to a frequency signal that is proportional to the output voltage signal. The duty cycle measuring apparatus may further comprise an output driver that drives the frequency signal to an output pad coupled to the output driver. A measurement device, external to the integrated circuit device, may measure a frequency of the frequency signal at the output pad and calculate a duty cycle for the signal under test based on the measured frequency.

These and other features and advantages of the present invention will be described in, or will become apparent to those of ordinary skill in the art in view of, the following detailed description of the illustrative embodiments.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIG. 2 is an exemplary block diagram of a duty cycle measurement mechanism in accordance with one illustrative embodiment;

FIG. 3 is an exemplary circuit diagram of one exemplary implementation of a duty cycle measurement mechanism in accordance with one illustrative embodiment;

DETAILED DESCRIPTION OF THE PREFERRED EMBODIMENTS

The illustrative embodiments provide an on-chip integrated circuit apparatus and method for measuring the duty cycle of a signal under test. The mechanisms of the illustrative embodiments may be implemented in any integrated circuit device in which a signal under test is to have its duty cycle measured. However, the illustrative embodiments are especially well suited for measuring duty cycle of signals under test that operate at very high frequencies. Such signals under test may be found in, for example, state of the art microprocessors and systems-on-a-chip.

Figure 1:
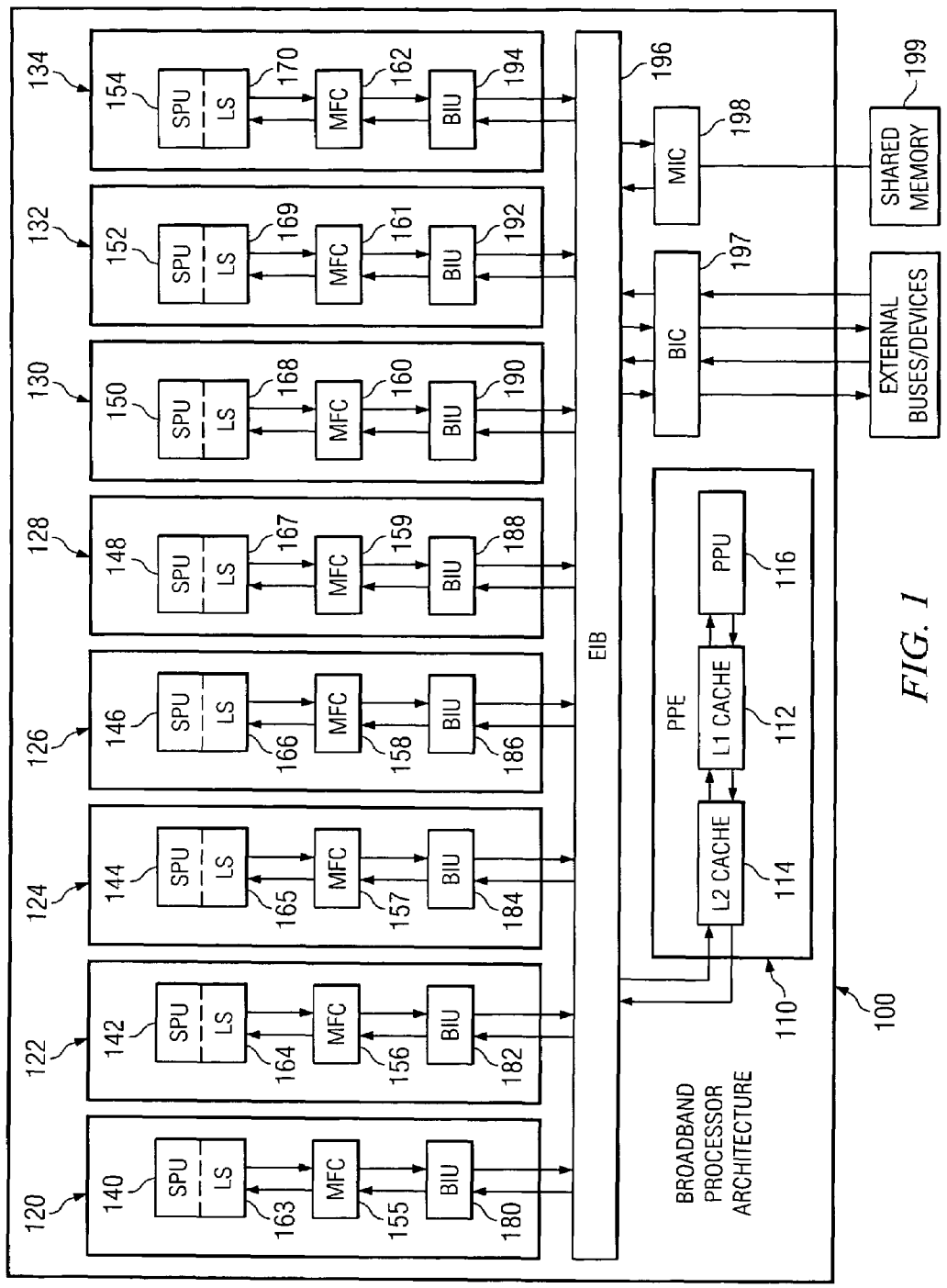
FIG. 1 is an exemplary block diagram of a system-on-a-chip in which aspects of an illustrative embodiment may be implemented.

One exemplary microprocessor in which aspects of the illustrative embodiments may be implemented is the CELL Broadband Engine (CBE) architecture microprocessor available from International Business Machines Corporation of Armonk, N.Y. An example block diagram of a CBE architecture microprocessor is shown in FIG. 1, discussed hereafter. While the exemplary embodiments will be described as being implemented in the CBE architecture microprocessor, the present invention is not limited to such. As mentioned above, the illustrative embodiments of the present invention have application to any integrated circuit device in which a signal under test's duty cycle is to be measured.

FIG. 1 is an exemplary block diagram of a data processing system in which aspects of an illustrative embodiment may be implemented. The exemplary data processing system shown in FIG. 1 is an example of the CELL Broadband Engine (CBE) data processing system. While the CBE will be used in the description of the illustrative embodiments, the present invention is not limited to such, as will be readily apparent to those of ordinary skill in the art upon reading the following description.

As shown in FIG. 1, the CBE 100 includes a power processor element (PPE) 110 having a processor (PPU) 116 and its L1 and L2 caches 112 and 114, and multiple synergistic processor elements (SPEs) 120-134 that each has its own synergistic processor unit (SPU) 140-154, memory flow control 155-162, local memory or store (LS) 163-170, and bus interface unit (BIU unit) 180-194 which may be, for example, a combination direct memory access (DMA), memory management unit (MMU), and bus interface unit. A high bandwidth internal element interconnect bus (EIB) 196, a bus interface controller (BIC) 197, and a memory interface controller (MIC) 198 are also provided.

The CBE 100 may be a system-on-a-chip such that each of the elements depicted in FIG. 1 may be provided on a single microprocessor chip. Moreover, the CBE 100 is a heterogeneous processing environment in which each of the SPUs may receive different instructions from each of the other SPUs in the system. Moreover, the instruction set for the SPUs is different from that of the PPU, e.g., the PPU may execute Reduced Instruction Set Computer (RISC) based instructions while the SPU execute vectorized instructions.

The SPEs 120-134 are coupled to each other and to the L2 cache 114 via the EIB 196. In addition, the SPEs 120-134 are coupled to MIC 198 and BIC 197 via the EIB 196. The MIC 198 provides a communication interface to shared memory 199. The BIC 197 provides a communication interface between the CBE 100 and other external buses and devices.

The PPE 110 is a dual threaded PPE 110. The combination of this dual threaded PPE 110 and the eight SPEs 120-134 makes the CBE 100 capable of handling 10 simultaneous threads and over 128 outstanding memory requests. The PPE 110 acts as a controller for the other eight SPEs 120-134 which handle most of the computational workload. The PPE 110 may be used to run conventional operating systems while the SPEs 120-134 perform vectorized floating point code execution, for example.

The SPEs 120-134 comprise a synergistic processing unit (SPU) 140-154, memory flow control units 155-162, local memory or store 160-174, and an interface unit 180-194. The local memory or store 160-174, in one exemplary embodiment, comprises a 256 KB instruction and data memory which is visible to the PPE 110 and can be addressed directly by software.

The PPE 110 may load the SPEs 120-134 with small programs or threads, chaining the SPEs together to handle each step in a complex operation. For example, a set-top box incorporating the CBE 100 may load programs for reading a DVD, video and audio decoding, and display, and the data would be passed off from SPE to SPE until it finally ended up on the output display. At 4 GHz, each SPE 120-134 gives a theoretical 32 GFLOPS of performance with the PPE 110 having a similar level of performance.

The memory flow control units (MFCs) 155-162 serve as an interface for an SPU to the rest of the system and other elements. The MFCs 155-162 provide the primary mechanism for data transfer, protection, and synchronization between main storage and the local storages 160-174. There is logically an MFC for each SPU in a processor. Some implementations can share resources of a single MFC between multiple SPUs. In such a case, all the facilities and commands defined for the MFC must appear independent to software for each SPU. The effects of sharing an MFC are limited to implementation-dependent facilities and commands.

Because variations in duty cycle of signals provided to high speed functional units, such as the SPUs 140-154, PPU 116, MIC 198, BIC 197, and the like, of an integrated circuit device, such as the microprocessor or SOC shown in FIG. 1, may cause performance degradation or may limit functionality of these functional units, it is important to measure duty cycle of the critical signals to these functional units in order to verify proper operation of the integrated circuit device. The illustrative embodiments provide an on-chip device for measuring duty cycle of a signal under test and providing an output to an output pad that is proportional to the duty cycle and which may be easily measured by external lab or manufacturing equipment. The on-chip device may be provided in association with functional units of an integrated circuit device or anywhere where the duty cycle of a signal under test is to be measured. The mechanisms of the illustrative embodiments may be implemented using simple circuits in a standard Complementary Metal Oxide Semiconductor (CMOS) process which requires very little area and can be powered off when it is not being used.

FIG. 2 is an exemplary block diagram of a duty cycle measurement mechanism in accordance with one illustrative embodiment. As shown in FIG. 2, the duty cycles measurement mechanism 200 includes a calibration signal source 210, a low pass filter 230, a voltage to frequency converter 240, and an output driver 250. In addition, the duty cycle measurement mechanism 200 receives a signal under test from a signal under test source 220.

The calibration signal source 210 provides a plurality of calibration voltage signals to the low pass filter 230 which are used to generate a calibration curve for the voltage to frequency converter 240 for the current operational conditions of the system in which the duty cycle measurement mechanism 200 is provided. Based on the various voltages, and the resulting frequencies generated by the voltage to frequency converter 240, a calibration curve identifying the gain characteristic of the voltage to frequency converter 240 may be obtained. This curve may then be used, such as by measuring equipment 260, when measuring an output signal's frequency, from the voltage to frequency converter 240, to thereby determine a corresponding gain characteristic for the voltage to frequency converter 240 for the particular signal under test voltage conversion. This gain characteristic may then be used by the measuring equipment 260 to calculate the duty cycle of the signal under test, as will be described in greater detail hereafter.

In operation, the low pass filter 230 receives an input signal, i.e. either a calibration signal or a signal under test, and essentially determines an average voltage of the input signal. This average voltage is provided to the voltage to frequency converter 240 which converts the voltage to an output signal having a frequency that is proportional to the input voltage. This frequency may be too high to output off-chip due to constraints on bandwidth of conventional off-chip connections. Thus, the voltage to frequency converter 240 may divide the frequency of the output signal by a predetermined factor in order to place the frequency of the output signal driven by the output driver 250 to within bandwidth requirements of an off-chip connection.

The output driver 250 drives the output signal from the voltage to frequency converter 240 to an output pad (not shown) which may be used by the measuring equipment 260 to measure the output frequency of the output signal. Based on the measured output frequency, the gain characteristic of the voltage to frequency converter 240 may be calculated using the calibration curve previously generated. Based on the measured output frequency, the division factor (if any) of the voltage to frequency converter 240, the known supply voltage, and the calculated gain characteristic, the duty cycle of the signal under test may be calculated by the measuring equipment 260.

Multiple calculations of the duty cycle at the same or different points in the integrated circuit device may be used to identify variations in duty cycle of high speed clock signals that may cause performance degradation or limited functionality of the functional elements of the integrated circuit device. Thus, by using the on-chip duty cycle measurement mechanism of the illustrative embodiment, duty cycle information may be brought off-chip for analysis so that areas of the integrated circuit device that may be subject to performance degradation may be identified and appropriate corrective action taken.

FIG. 3 is an exemplary circuit diagram of one exemplary implementation of a duty cycle measurement mechanism 300 in accordance with an illustrative embodiment. As shown in FIG. 3, in an illustrative embodiment, a signal under test 310 is provided as an input to a low pass filter 330 via a multiplexer 320 or other switching network in a way that preserves the duty cycle of the original signal under test. In other words, things that may serve to distort the duty cycle, e.g., coupling from adjacent lines, non-linear active components, loading, unbalanced buffer stages, etc., are avoided so as to preserve the duty cycle. The multiplexer 320 is used to select one of a plurality of inputs for output to the low pass filter 330. The plurality of inputs include calibration voltage signal inputs V1-Vn from a voltage divider 390 are provided to the multiplexer 320 along with the signal under test 310. Based on a control signal that may be generated, for example, by an off-chip measurement device or equipment, the multiplexer 320 outputs one of the calibration voltage signals V1-Vn or the signal under test 310. The calibration voltage signals V1-Vn are output to the low pass filter 330 when calibration of the voltage-controlled oscillator 340 is being performed, as discussed hereafter. The signal under test 310 is output to the low pass filter 330, for example, when the duty cycle measurement mechanism 300 is operating on the high speed clock signal, i.e. the signal under test 310, of an operational integrated circuit device.

The low pass filter (LPF) 330 may be implemented as a single-pole resistance-capacitance (RC) network which may be fabricated simply using a standard CMOS process, for example. The LPF 330 essentially determines an average value of the signal under test 310. The LPF 330 generates a direct current (DC) voltage, Vdc, that is proportional to the duty-cycle of the signal under test, e.g., Vdc=duty cycle*Vdd, where Vdd is the supply voltage. The bandwidth of the low pass filter 330 is set low enough to generate a DC value and properly attenuate the alternating current (AC) components of the signal under test 310. The bandwidth is further set such that the bandwidth is not so low that the time constant of the low pass filter 330 would add unacceptably large settling time for the measurements. For example, for a 5 Ghz signal under test 310, a filter with approximately 5 MHz bandwidth adequately reduces the AC components of the signal under test 310 and requires 100 nsecs settling time.

The low pass filter 330 is connected to the control input of a voltage-controlled oscillator (VCO) 340 which has a voltage-to-frequency gain characteristic, KO. In one preferred embodiment, the VCO 340 gain KO is linear however the present invention is not limited to such an embodiment and non-linear VCO 340 gain characteristics may be used without departing from the spirit and scope of the present invention.

The VCO 340 translates the DC voltage at its input to a frequency which may be too high for directly bringing off-chip through low bandwidth drivers. Thus, the output of the VCO 340 is coupled to a frequency divider 340 which scales the VCO output frequency down by a factor of N. The resulting scaled down output signal is provided to an output driver 360 which is connected to an output pad 370 through which the output signal may be measured using a frequency counter, oscilloscope, or other standard lab or manufacturing measurement equipment. As a result, the measurement equipment may calculate the duty cycle of the signal under test from the frequency measure on the output pad 370, e.g., duty cycle=freq.*N/(Vdd*KO).

Because practical VCOs show variations in KO due to process, temperature, supply voltage, and the like, and may have many non-linearities, it is important to understand these variations and be able to calibrate the VCO's gain characteristic KO prior to use in measuring the duty cycle of the signal under test 310. The voltage divider 390, which is used to perform this calibration, may be coupled to the multiplexer 320 or other switching element through which the signal under test 310 is coupled to the low pass filter 330. The voltage divider 390 provides a plurality of reference voltages V1-Vn which may be individually connected to the low pass filter 330. The voltage values V1-Vn may be determined by using the simple voltage division equation Vdd*R1/R2, where R1 is the total resistance from a sense node to ground and R2 is a total resistance value from Vdd to ground. The voltage value, along with the sensed frequency, may be used by the external measurement equipment to calculate a KO value for the VCO, e.g., KO=freq./Vn.

Figure 4:
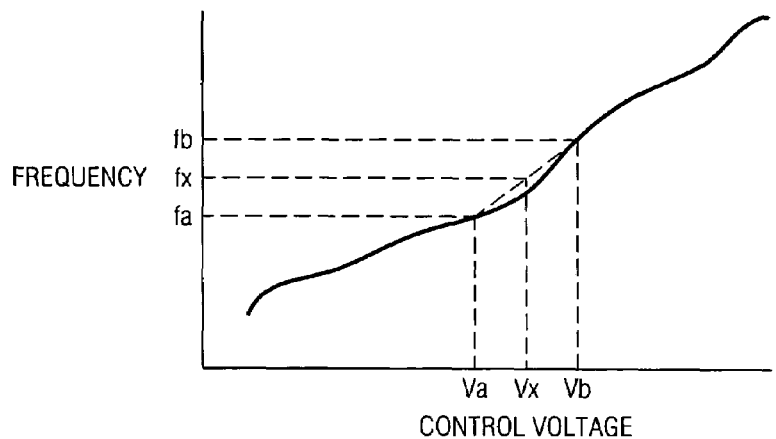
FIG. 4 is an exemplary diagram illustrating a calibration curve that may be developed for a voltage-controlled oscillator of one illustrative embodiment using a plurality of reference voltage inputs.

By using a plurality of reference voltages and corresponding frequency measurements, a calibration curve may be determined. FIG. 4 illustrates an exemplary calibration curve that may be developed for a VCO of the illustrative embodiment using a plurality of reference voltages. As shown in FIG. 4, the curve may be non-linear, but may be approximated using a linear approximation algorithm. The calibration curve developed using the mechanisms of the illustrative embodiment may be used with an actual frequency measurement to determine the KO value for the VCO, e.g., KO=(fb−fa)/(Vb−Va), where fa<fx<fb.

Referring again to FIG. 3, in addition to the above, a bidirectional (bidi) pad 380 and switch 385 may be coupled to the input of the VCO 340. The switch 385 is included to reduce noise pickup when the bidi pad 380 is not being used. The bidi pad 380 may be used to measure the applied voltage to the VCO 340 during calibration if resistor tolerance is an issue (if the resistors are not matched properly, the voltages V1 to Vn will have error). The bidi pad 380 may also be used to apply an external voltage directly to the low pass filter 330 (either side of the filter resistor Rfilt) if the calibration granularity is too large. That is, if an additional point in the calibration curve is needed due to the calibration granularity being too large, a different voltage that can be used to generate a new point on the calibration curve may be provided through the bidi pad 380 so as to provide a smaller granularity between points on the calibration curve.

Thus, with the mechanisms of the illustrative embodiments, the supply voltage Vdd and the frequency divisor N are known, and the frequency of the output signal from the driver 360 may be measured and known. Based on the measured frequency, two points on the calibration curve may be used to interpolate the gain characteristic KO of the VCO 340 using the equation KO=(fb−fa)/(Vb−Va), as mentioned above. Thus, all of the values of the equation for calculation of the duty cycle are known, duty cycle=freq.*N/(Vdd*KO). Therefore, using the mechanisms of the illustrative embodiments, a frequency signal proportional to the voltage of the signal under test may be generated and scaled for output off-chip. From the frequency signal, an off-chip or external measurement device may accurately calculate the duty cycle of the signal under test 310.

Figure 5A:
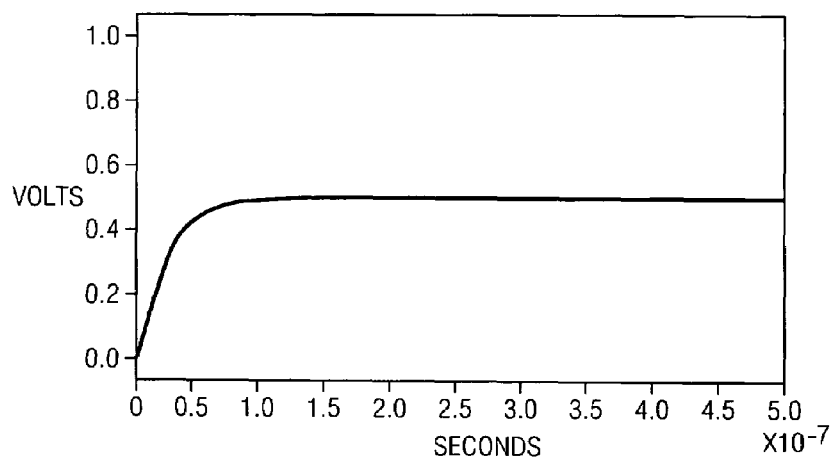
FIGS. 5A and 5B are exemplary graphs illustrating the control voltage of the VCO and the output frequency for the signal under test, using the mechanism of one illustrative, with a duty cycle of 50%.
Figure 5B:
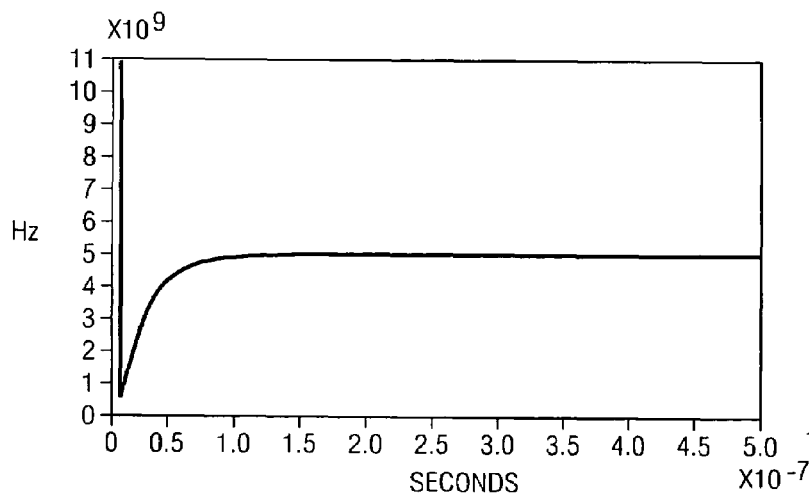
Figure 6A:
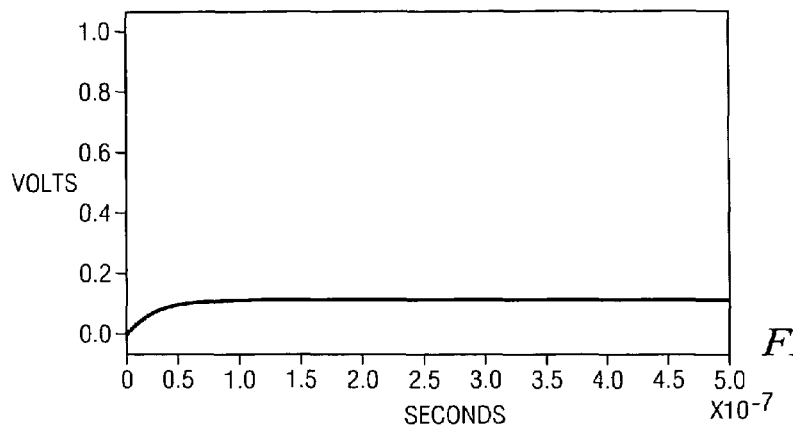
FIGS. 6A and 6B are exemplary graphs illustrating the control voltage of the VCO and the output frequency for the signal under test, using the mechanism of one illustrative embodiment, with a duty cycle of 10%.
Figure 6B:
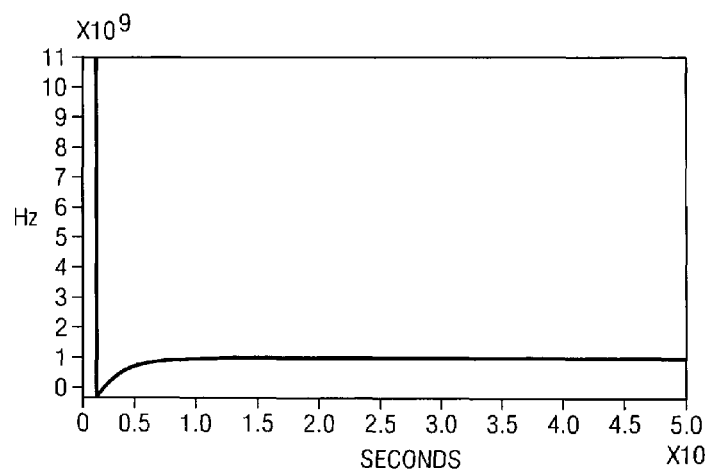
Figure 7A:
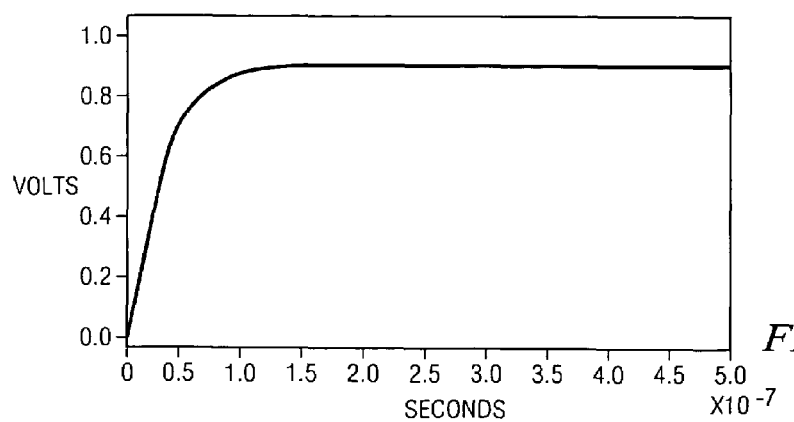
FIGS. 7A and 7B are exemplary graphs illustrating the control voltage of the VCO and the output frequency for the signal under test, using the mechanism of one illustrative embodiment, with a duty cycle of 90%.
Figure 7B:
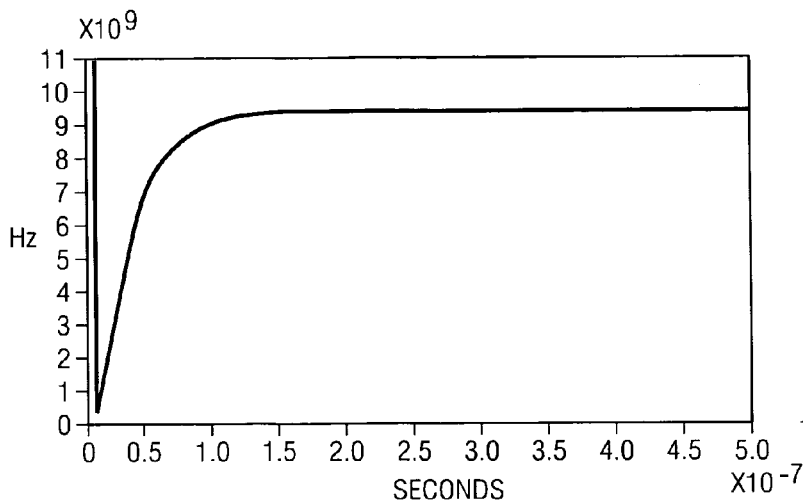

FIGS. 5A and 5B are exemplary graphs illustrating the control voltage of the VCO and the output frequency for the signal under test, using the mechanism of one illustrative embodiment, with a duty cycle of 50%. FIGS. 6A and 6B are exemplary graphs illustrating the control voltage of the VCO and the output frequency for the signal under test, using the mechanism of one illustrative embodiment, with a duty cycle of 10%. FIGS. 7A and 7B are exemplary graphs illustrating the control voltage of the VCO and the output frequency for the signal under test, using the mechanism of one illustrative embodiment, with a duty cycle of 90%. As shown in FIGS. 4A-6B, the frequency output of the duty cycle measurement mechanisms of the illustrative embodiments is proportional to the voltage of the signal under test 310 for three representative duty cycles. This same proportionality is present for all duty cycles and thus, the frequency output of the illustrative embodiments may be used to accurately calculate the duty cycle of the signal under test 310.

Figure 8:
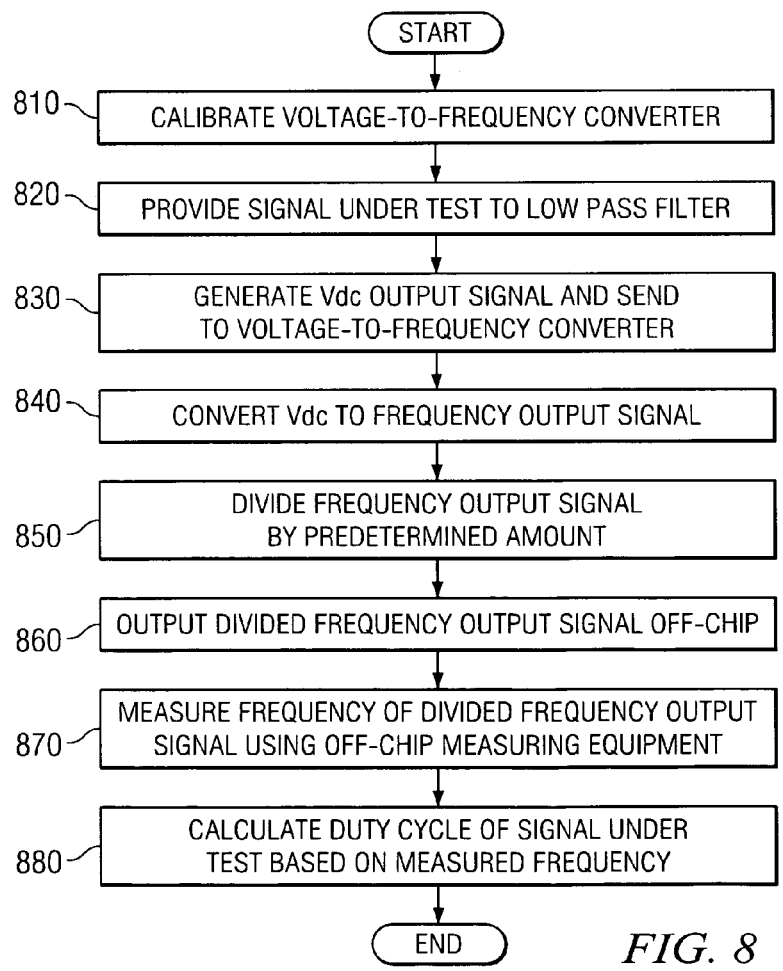
FIG. 8 is a flowchart outlining an exemplary operation of one illustrative embodiment when measuring duty cycle.

FIG. 8 is a flowchart outlining an exemplary operation of one illustrative embodiment when measuring duty cycle. It will be understood that each block of the flowchart illustration, and combinations of blocks in the flowchart illustration, can be implemented by computer program instructions. These computer program instructions may be provided to a processor or other programmable data processing apparatus to produce a machine, such that the instructions which execute on the processor or other programmable data processing apparatus create means for implementing the functions specified in the flowchart block or blocks. These computer program instructions may also be stored in a computer-readable memory or storage medium that can direct a processor or other programmable data processing apparatus to function in a particular manner, such that the instructions stored in the computer-readable memory or storage medium produce an article of manufacture including instruction means which implement the functions specified in the flowchart block or blocks.

Accordingly, blocks of the flowchart illustration support combinations of means for performing the specified functions, combinations of steps for performing the specified functions and program instruction means for performing the specified functions. It will also be understood that each block of the flowchart illustration, and combinations of blocks in the flowchart illustration, can be implemented by special purpose hardware-based computer systems which perform the specified functions or steps, or by combinations of special purpose hardware and computer instructions.

As shown in FIG. 8, the operation starts by calibrating the voltage to frequency converter (step 810). As described above, this may involve providing a plurality of reference voltages to a low pass filter and converting the output voltage of the low pass filter to a frequency that is measured and used to generate a calibration curve for the voltage to frequency converter. Thereafter, the signal under test is provided to the low pass filter (step 820) which attenuates the alternating current portion of the signal under test and outputs a direct current voltage signal to the voltage to frequency converter (step 830). The direct current voltage signal is converted to a frequency signal (step 840).

The resulting frequency signal may then be divided by a frequency divider to place the frequency signal in a range appropriate for output off-chip (step 850). The divided frequency signal is provided to an output driver which drives the divided frequency signal to an output pad (step 860). An off-chip, external, measurement apparatus may then be used to measure the frequency of the divided frequency signal (step 870) and a duty cycle for the signal under test may be calculated based on the measured frequency (step 880). The operation then terminates.

Thus, the illustrative embodiments provide mechanisms for measuring duty cycle of an integrated circuit device, such as a microprocessor or system-on-a-chip (SOC). The mechanisms of the illustrative embodiments generate a frequency which is proportional to the duty cycle and which can be measured using common lab or manufacturing equipment. The mechanisms of the illustrative embodiments may be implemented using simple circuits in a standard Complementary Metal Oxide Semiconductor (CMOS) process which requires very little area and can be powered off when it is not being used.

The circuit as described above may be part of the design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor. Moreover, the end products in which the integrated circuit chips may be provided may include game machines, game consoles, hand-held computing devices, personal digital assistants, communication devices, such as wireless telephones and the like, laptop computing devices, desktop computing devices, server computing devices, a portable computing device, or any other computing device.

The description of the illustrative embodiments has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in a data processing system, for measuring a duty cycle of a signal under test, comprising:
    filtering an input signal to generate an output voltage signal;
    converting the output voltage signal to a frequency signal that is proportional to the output voltage signal;
    measuring a frequency of the frequency signal;
    calculating a duty cycle of the input signal based on the measured frequency; and
    repeating the filtering, converting, measuring, and calculating operations at the same or different points in the data processing system to identify variations in duty cycle of a high speed clock signal, provided as the input signal.

2. The method of claim 1, further comprising:
    receiving a plurality of calibration signals and a signal under test;
    selecting one of the plurality of calibration signals or the signal under test to be the input signal.

3. The method of claim 2, wherein the plurality of calibration signals are reference voltage signals that are used to calibrate a voltage to frequency converter that converts the output voltage signal to a frequency signal that is proportional to the output voltage signal.

4. The method of claim 2, wherein one of the plurality of calibration signals is selected to be the input signal when performing calibration of a voltage to frequency converter that converts the output voltage signal to a frequency signal that is proportional to the output voltage signal.

5. The method of claim 1, wherein the output voltage signal represents an average voltage of the input signal.

6. The method of claim 1, further comprising:
    receiving, as the input signal, an input voltage signal from a device that is external to the data processing system via a bi-directional pad.

7. The method of claim 1, wherein the filtering and converting operations are performed on an integrated circuit chip and the measuring and calculating operations are performed externally to the integrated circuit chip.

8. A method, in a data processing system, for measuring a duty cycle of a signal under test, comprising:
    receiving a plurality of calibration signals and a signal under test;
    selecting one of the plurality of calibration signals or the signal under test to be an input signal;
    filtering the input signal to generate an output voltage signal;
    converting the output voltage signal to a frequency signal that is proportional to the output voltage signal;
    measuring a frequency of the frequency signal; and
    calculating a duty cycle of the input signal based on the measured frequency, wherein one of the plurality of calibration signals is selected to be the input signal when performing calibration of a voltage to frequency converter that converts the output voltage signal to a frequency signal that is proportional to the output voltage signal and wherein calibrating the voltage to frequency converter comprises generating a calibration curve that maps an input voltage to an output frequency for the plurality of calibration signals.

9. A method, in a data processing system, for measuring a duty cycle of a signal under test, comprising:
    filtering an input signal to generate an output voltage signal;
    converting the output voltage signal to a frequency signal that is proportional to the output voltage signal;
    measuring a frequency of the frequency signal;
    calculating a duty cycle of the input signal based on the measured frequency; and
    dividing the frequency signal by a predetermined factor to place the frequency signal within a bandwidth requirement for providing the frequency signal to a measurement device for measuring the frequency of the frequency signal.

10. An apparatus for measuring a duty cycle of a signal under test in an integrated circuit device, comprising:
    a filter, wherein the filter receives an input signal and outputs an output voltage signal;
    a voltage to frequency converter coupled to the filter, wherein the voltage to frequency converter converts the output voltage signal to a frequency signal that is proportional to the output voltage signal; and
    an output driver that drives the frequency signal to an output pad coupled to the output driver, wherein a measurement device, external to the integrated circuit device, measures a frequency of the frequency signal at the output pad and calculates a duty cycle for the signal under test based on the measured frequency, and wherein the voltage to frequency converter comprises a voltage-controlled oscillator.

11. The apparatus of claim 10, further comprising:
    a multiplexer coupled to an input of the filter, wherein the multiplexer receives a plurality of calibration signals and a signal under test, and selects one of the plurality of calibration signals or the signal under test to output to the filter.

12. The apparatus of claim 11, wherein the plurality of calibration signals are reference voltage signals that are used to calibrate the voltage to frequency converter.

13. The apparatus of claim 12, wherein the voltage to frequency converter is calibrated by generating a calibration curve that maps an input voltage to an output frequency for the plurality of calibration signals.

14. The apparatus of claim 10, further comprising:
    a bi-direction pad coupled to an input of the voltage to frequency converter, wherein an input voltage signal is received, as the input signal, from a device that is external to the apparatus via the bi-directional pad.

15. The apparatus of claim 10, wherein the voltage to frequency converter further comprises a frequency divider coupled to an output of the voltage-controlled oscillator and which divides a frequency of a frequency signal output by the voltage-controlled oscillator by a predetermined amount.

16. The apparatus of claim 10, wherein the apparatus is part of one a toy, a game machine, a game console, a hand-held computing device, a personal digital assistant, a communication device, a wireless telephone, a laptop computing device, a desktop computing device, a server computing devices, and a portable computing device.

17. The apparatus of claim 10, wherein the apparatus is part of a multi-processor system-on-a-chip having at least two heterogeneous processors having different types of instruction sets.

18. A system-on-a-chip, comprising:
a control processor;
at least one co-processor coupled to the control processor; and
a duty cycle measuring apparatus coupled to one or more of the control processor or the at least one co-processor, wherein the duty cycle measuring apparatus comprises:
a filter, wherein the filter receives an input signal from one of the control processor or the co-processor and outputs an output voltage signal;
a voltage to frequency converter coupled to the filter, wherein the voltage to frequency converter converts the output voltage signal to a frequency signal that is proportional to the output voltage signal; and
an output driver that drives the frequency signal to an output pad coupled to the output driver, wherein a measurement device, external to the integrated circuit device, measures a frequency of the frequency signal at the output pad and calculates a duty cycle for the signal under test based on the measured frequency,
and wherein the voltage to frequency converter comprises a voltage-controlled oscillator.

* * * * *